US011056965B2

(12) United States Patent
Matsubara et al.

(10) Patent No.: US 11,056,965 B2
(45) Date of Patent: Jul. 6, 2021

(54) GATE DRIVER AND POWER CONVERTER

(71) Applicant: FUJI ELECTRIC CO., LTD., Kanagawa (JP)

(72) Inventors: Kunio Matsubara, Tokyo (JP); Tsuyoshi Nagano, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/797,202

(22) Filed: Feb. 21, 2020

(65) Prior Publication Data

US 2021/0013792 A1    Jan. 14, 2021

(30) Foreign Application Priority Data

Jul. 8, 2019   (JP) .............................. JP2019-126959

(51) Int. Cl.
   *H02M 1/08*       (2006.01)
   *H03K 17/0412*    (2006.01)
   *H02M 1/00*       (2006.01)

(52) U.S. Cl.
   CPC ........ *H02M 1/08* (2013.01); *H03K 17/04123* (2013.01); *H02M 2001/0054* (2013.01)

(58) Field of Classification Search
   CPC .. H02J 7/00; H02J 7/022; H02M 1/00; H02M 1/08; H02M 2001/00; H02M 2001/0054; H02M 3/00; H02M 3/33523; H02M 7/00; H02M 7/003; H02M 7/537; H03K 17/00; H03K 17/04123; Y02B 70/00; Y02B 70/1441

USPC ......................................................... 363/131
See application file for complete search history.

(56) References Cited

U.S. PATENT DOCUMENTS

| 2014/0091850 A1* | 4/2014 | Kohama | ................ | H03K 17/06 |
| | | | | 327/382 |
| 2015/0311692 A1* | 10/2015 | Hiyama | ............... | H03K 17/168 |
| | | | | 361/31 |
| 2020/0021282 A1* | 1/2020 | Yamamoto | ......... | H03K 17/0826 |

FOREIGN PATENT DOCUMENTS

JP              4935266          5/2012

* cited by examiner

*Primary Examiner* — Lincoln D Donovan
*Assistant Examiner* — Dave Mattison
(74) *Attorney, Agent, or Firm* — IPUSA, PLLC

(57) ABSTRACT

A gate driver for driving a gate of a switching element in accordance with an input signal is provided. The gate driver is configured to change a gate driving condition in accordance with a detected value of power supply voltage. Each time when the switching element is turned off, the gate driver stores a time width from a time when the input signal is switched to an off command to a time when switch-off surge occurs in the switching device. If it is determined that the gate driving condition should be changed during turn-off operation of the switching element, the gate driver switches the gate driving condition when a time corresponding to the time width stored at a previous turn-off is elapsed after a current turn-off of the switching element is started.

12 Claims, 6 Drawing Sheets

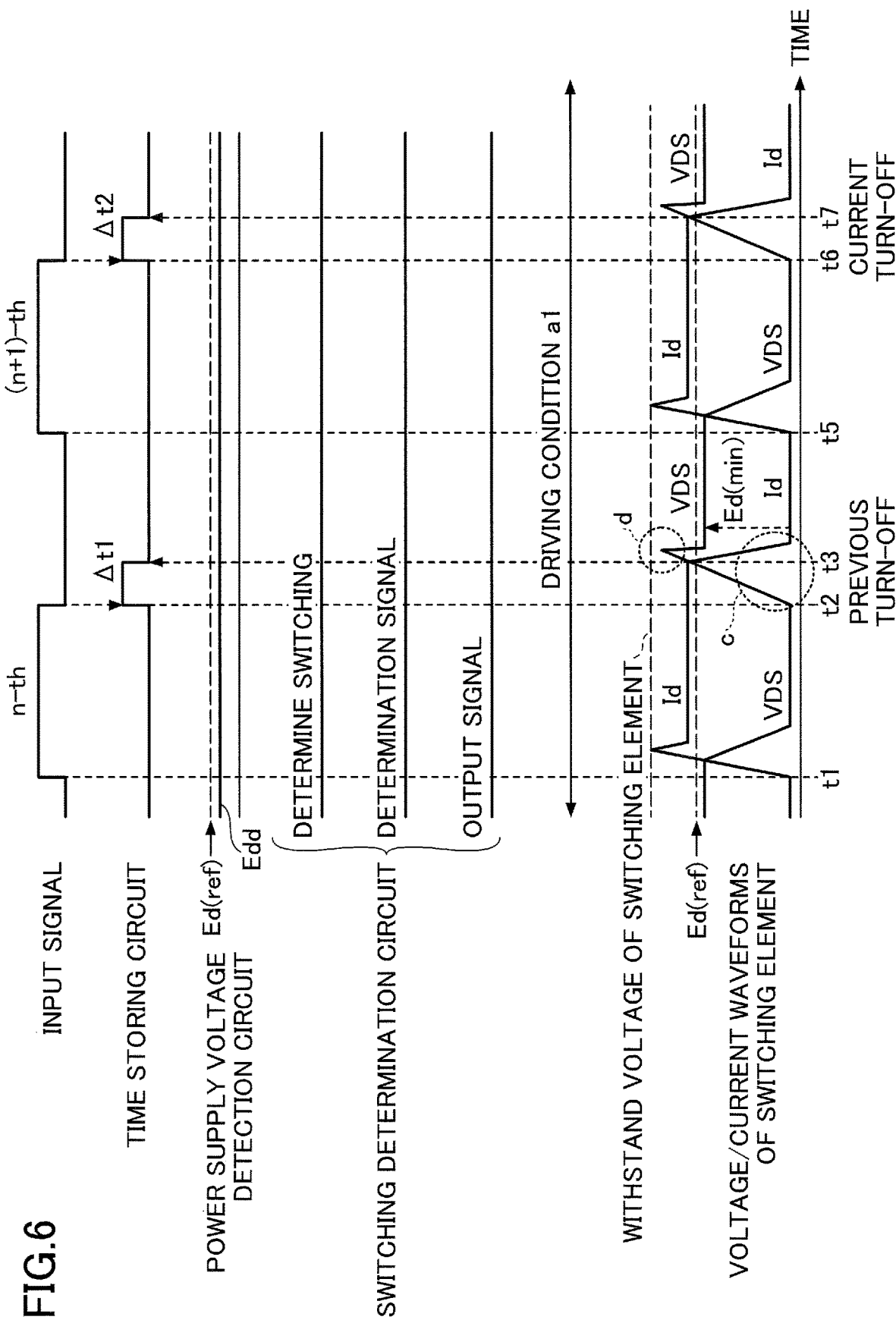

GATE DRIVER AND POWER CONVERTER

CROSS-REFERENCE TO RELATED APPLICATION

This patent application is based on and claims priority to Japanese Patent Application No. 2019-126959 filed on Jul. 8, 2019, the entire contents of which are incorporated herein by reference.

BACKGROUND OF THE INVENTION

1. Field of the Invention

The present invention relates to a gate driver and a power converter.

2. Description of the Related Art

Conventionally, in order to reduce surge voltage and switching losses, an active gate drive technique is known, in which switching speed is changed at an appropriate timing in accordance with drain current or collector current (hereinafter, referred to as main current) flowing through a switching element. For example, Patent Document 1 discloses a gate drive circuit that stores a length of time (surge period) from a time when a turn-off command for turning off a switching element is issued to a time of occurrence of voltage surge. When the switching element is to be turned off, the gate drive circuit determines a timing of changing effective gate resistance of the switching element, based on the surge period having been stored when the switching element was previously turned off.

According to the description of Patent Document 1, as switching speed is increased during a surge period by reducing magnitude of effective gate resistance, switching losses can be reduced. After the surge period has elapsed, because the effective gate resistance is increased, surge voltage can be reduced. Further, according to the description of Patent Document 1, since magnitude of the effective gate resistance at the time of turn-off is changed by using information at a time of previous turn-off, a time margin required for feedback control can be secured.

Meanwhile, power supply voltage supplied from a direct current (DC) power supply (potential difference between a high potential output of the DC power supply and a low potential output of the DC power supply) varies to some extent due to a change in input voltage to the DC power supply or some other reason. Therefore, a gate driver that drives a gate of a switching element connected between a high potential output and a low potential output of a power supply must be designed such that switch-off surge voltage does not exceed withstand voltage of the switching element even if maximum main current flows at maximum power supply voltage.

Therefore, for example, in a case in which power supply voltage Vd is reduced to a minimum value Ed (min) as illustrated in FIG. 1, it is considered that switch-off surge voltage does not exceed withstand voltage (element withstand voltage) of a switching element even if a gate driving condition is not switched to a condition in which gate resistance is increased.

However, with the related art technique of increasing gate resistance each time when turning-off a switching element to suppress switch-off surge voltage, a rate of change of the main current per time (dI/dt) becomes always gentle at each turn-off, as illustrated in FIG. 2. Therefore, when the power supply voltage Vd is lowered relative to the maximum value, switching losses at turn-off increase compared to a case such as FIG. 1 in which the gate driving condition is not switched. As a result, for example, there is a risk that power conversion efficiency may decrease or a size of cooling element used to cool the switching element may become larger.

Accordingly, the present disclosure provides a gate driver and a power converter capable of achieving both suppression of switch-off surge voltage and reduction of switching losses even if power supply voltage varies.

RELATED-ART DOCUMENTS

Patent Document

[Patent Document 1] Japanese Patent No. 4935266

SUMMARY OF THE INVENTION

In the present disclosure, there is provision of a gate driver including a drive circuit configured to drive a gate of a switching element connected between a high electric potential output of a power supply and a low electric potential output of the power supply, in accordance with an input signal indicating a command to turn on or to turn off the switching element; a switch-off surge detection circuit configured to detect switch-off surge that occurs in the switching element; a time storing circuit configured to store a time width from a time when the input signal is switched to a command to turn off the switching element to a time when the switch-off surge detection circuit detects occurrence of the switch-off surge; a switching determination circuit configured to determine whether or not to switch a gate driving condition of the switching element, in accordance with a detected value of power supply voltage, the power supply voltage being a potential difference between the high electric potential output of the power supply and the low electric potential output of the power supply; and a driving condition switching circuit configured to switch the gate driving condition in response to a determination by the switching determination circuit to switch the gate driving condition. The gate driving condition is switched when a time corresponding to the time width stored at a previous turn-off of the switching element is elapsed, after a current turn-off of the switching element is started.

BRIEF DESCRIPTION OF THE DRAWINGS

FIG. 6 is a timing chart illustrating an example of an operation of the gate driver in a case in which power supply voltage is low.

DETAILED DESCRIPTION OF THE PREFERRED EMBODIMENTS

Hereinafter, embodiments according to the present disclosure will be described with reference to the drawings.

Figure 1:
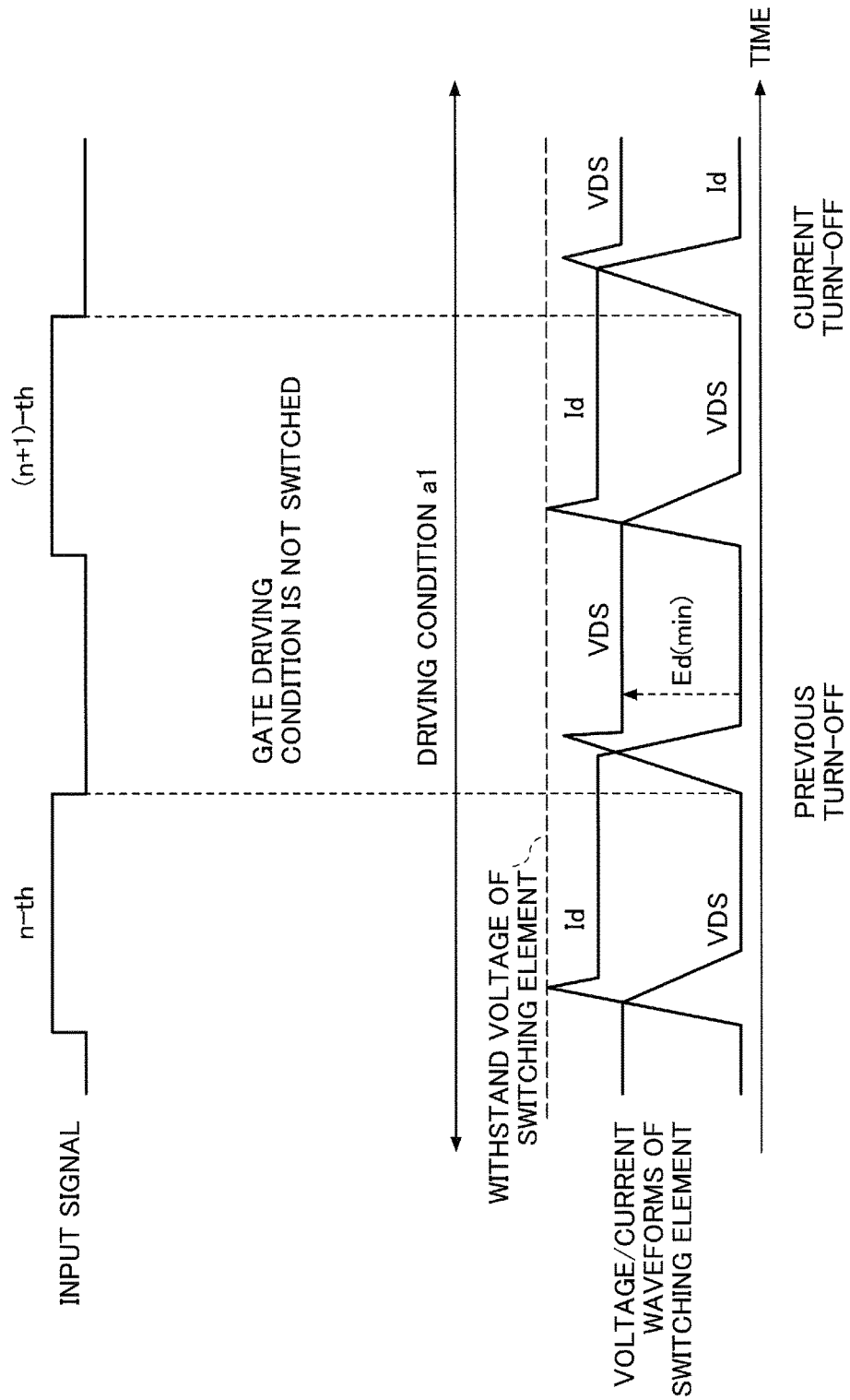
FIG. 1 is a timing chart in a case in which a surge suppression technique is not applied.
Figure 2:
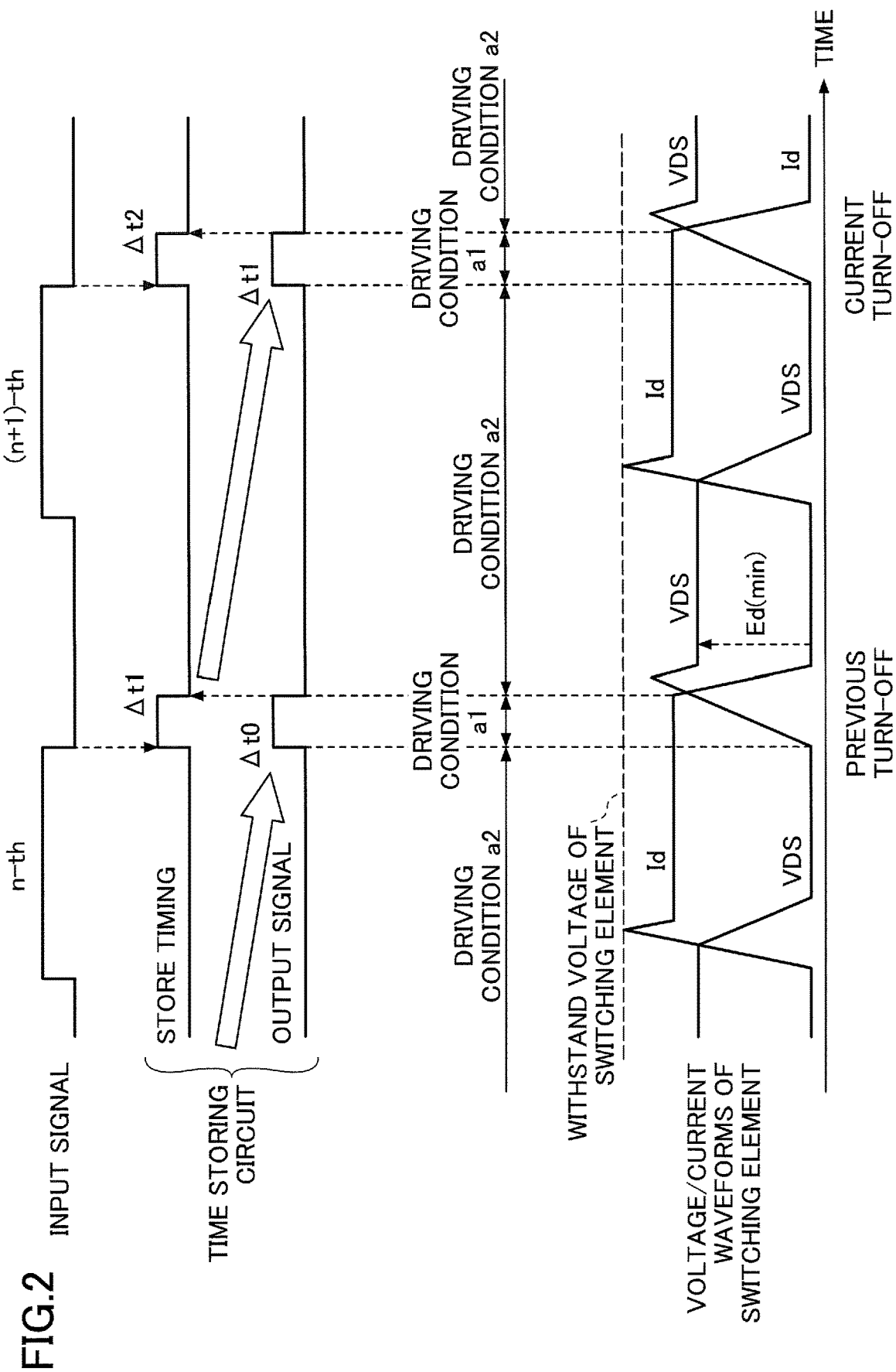
FIG. 2 is a timing chart in a case in which a surge suppression technique is applied.
Figure 3:
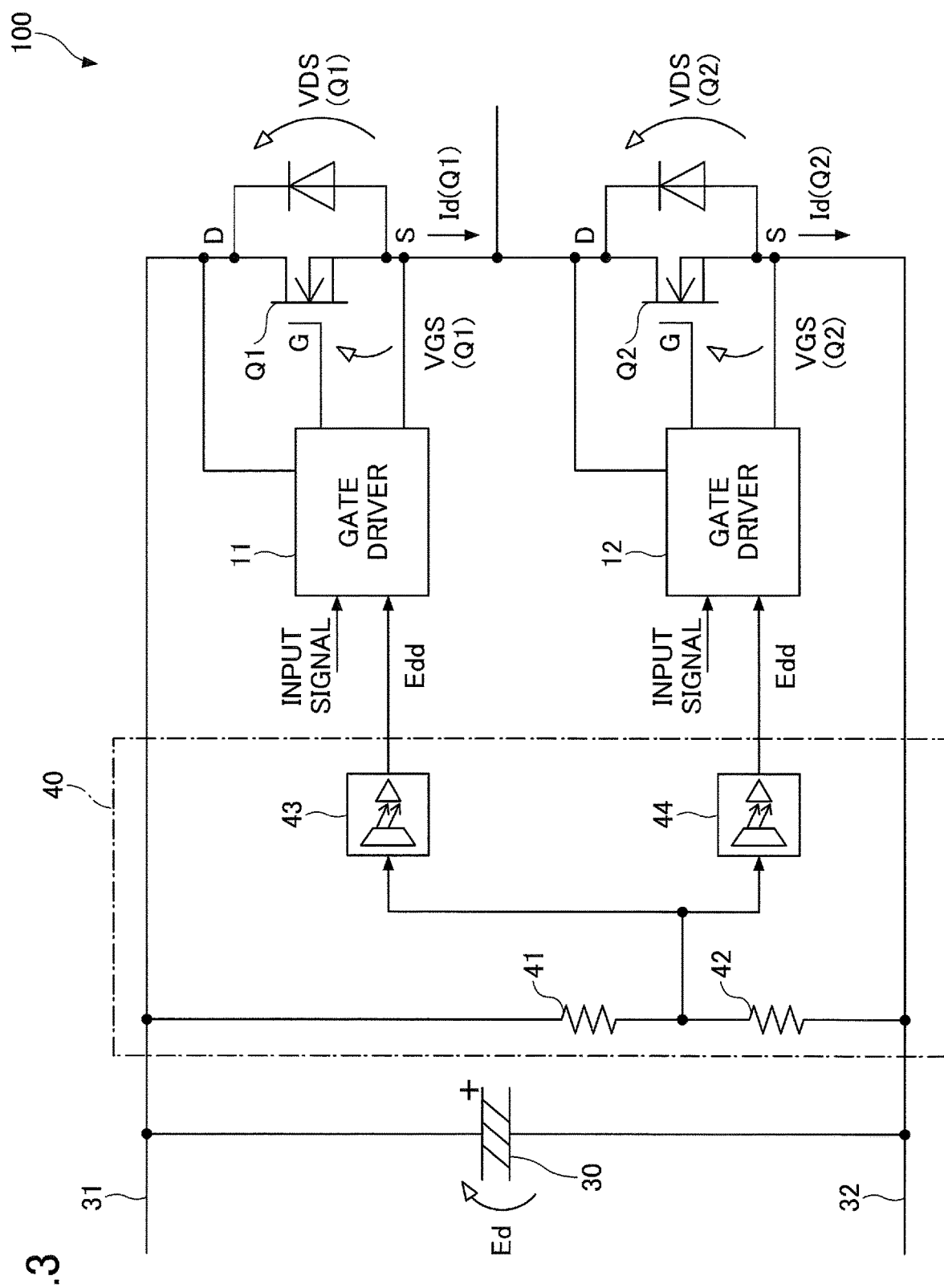
FIG. 3 is a diagram illustrating an example of a configuration of a power converter.

FIG. 3 is a diagram illustrating an example of a configuration of a power converter. The power converter 100 illustrated in FIG. 3 is a device that converts DC input power to a desired DC or AC output power using a switching element Q1 at a high-side and a switching element Q2 at a low-side. A load (not illustrated) is connected to a connection point between the switching element Q1 and the switching element Q2. The power converter 100 includes a high electric potential output of power supply 31, a low electric potential output of power supply 32, a capacitor 30, the switching elements Q1 and Q2, a power supply voltage detection circuit 40, and gate drivers 11 and 12. The high electric potential output of power supply 31 may also be referred to as a "high power supply potential output 31", and the low electric potential output of power supply 32 may also be referred to as a "low power supply potential output 32".

The high power supply potential output 31 and the low power supply potential output 32 are electrically conductive parts that are connected to a DC power supply (not illustrated) and are supplied with DC power from the DC power supply. Examples of the DC power supply include a rectifier circuit, a converter, and a regulator. The low power supply potential output 32 has a lower electric potential than the high power supply potential output 31. Power supply voltage Ed of DC is applied between the high power supply potential output 31 and the low power supply potential output 32.

The capacitor 30 is a capacitor element that smoothes the power supply voltage Ed. An example of the capacitor 30 includes an electrolytic capacitor. The capacitor 30 has one end connected to the high power supply potential output 31 and the other end connected to the low power supply potential output 32.

Each of the switching elements Q1 and Q2 is a voltage driven semiconductor device having a control electrode (gate), a first main electrode (collector or drain), and a second main electrode (emitter or source). Examples of the switching elements Q1 and Q2 include a metal oxide semiconductor field effect transistor (MOSFET) and an insulated gate bipolar transistor (IGBT). FIG. 3 illustrates a case in which each of the switching elements Q1 and Q2 is an N-channel MOSFET having a gate G, a drain D, and a source S.

The switching elements Q1 and Q2 may be made of a semiconductor such as Si (silicon), or may be a wide-bandgap device made of a wide-bandgap semiconductor such as SiC (silicon carbide), GaN (gallium nitride), $Ga_2O_3$ (gallium oxide), or diamond. Applying wide-bandgap devices to the switching elements Q1 and Q2 enhances an effect of loss reduction of the switching elements Q1 and Q2.

The switching elements Q1 and Q2 are connected in series with each other. The switching element Q1 is connected between the high power supply potential output 31 and the low power supply potential output 32, and is connected to the low power supply potential output 32 through the switching element Q2. The switching element Q2 is connected between the high power supply potential output 31 and the low power supply potential output 32, and is connected to the high power supply potential output 31 via the switching element Q1. The switching element Q1 has the gate G connected to the gate driver 11, the drain D connected to the high power supply potential output 31, and the source S connected to the drain D of the switching element Q2. The switching element Q2 has the gate G connected to the gate driver 12, the source S connected to the low power supply potential output 32, and the drain D connected to the source S of the switching element Q1. A diode is connected in antiparallel with each of the switching elements Q1 and Q2. That is, the source S of the switching element Q1 (or Q2) is connected to an anode terminal of the diode, and the drain D of the switching element Q1 (or Q2) is connected to a cathode terminal of the diode.

The power supply voltage detection circuit 40 detects the power supply voltage Ed between the high power supply potential output 31 and the low power supply potential output 32, and outputs a detected value of the power supply voltage Ed to each of the gate drivers 11 and 12. In the present embodiment, the detected value of the power supply voltage Ed is referred to as "Edd".

For example, the power supply voltage detection circuit 40 includes a voltage divider circuit formed of resistors 41 and 42, and isolation amplifiers 43 and 44 to which voltage divided by the voltage divider circuit is input. The voltage divider circuit divides the power supply voltage Ed by the resistors 41 and 42, and supplies the voltage obtained by dividing the power supply voltage Ed to each of the isolation amplifiers 43 and 44. Hereinafter, the voltage supplied from the voltage divider circuit to the isolation amplifiers 43 and 44 is referred to as a "divided voltage". Each of the isolation amplifiers 43 and 44 amplifies the divided voltage supplied from the voltage divider circuit, and outputs the respective amplified divided voltages. The amplified divided voltages supplied from the isolation amplifiers 43 and 44 to the gate drivers 11 and 12 respectively are signals each representing a voltage value (e.g. Edd) of the power supply voltage Ed.

It should be noted that, because an input of the isolation amplifier 43 is electrically isolated from an output of the isolation amplifier 43, the isolation amplifier 43 is configured to convert an electric potential with respect to the low power supply potential output 32 to an electric potential with respect to the source S of the switching element Q1, and to output the electric potential with respect to the source S of the switching element Q1. Similarly, because an input of the isolation amplifier 44 is electrically isolated from an output of the isolation amplifier 44, the isolation amplifier 44 is configured to convert an electric potential with respect to the low power supply potential output 32 to an electric potential with respect to the source S of the switching element Q2, and to output the electric potential with respect to the source S of the switching element Q2. Because respective inputs of the isolation amplifiers 43 and 44 are electrically isolated from respective outputs of the isolation amplifiers 43 and 44, common mode noise can be reduced.

The gate driver 11 is a drive circuit that provides positive or negative voltage to the gate of the switching element Q1 to turn on and/or turn off the switching element Q1. The gate driver 12 is a drive circuit that provides positive or negative voltage to the gate of the switching element Q2 to turn on and/or turn off the switching element Q2. The gate driver 11 at the high-side drives the gate of the switching element Q1 using an active gate drive technique that adjusts switching speed of the switching element Q1 during turn-off of the switching element Q1. The gate driver 12 at the low-side drives the gate of the switching element Q2 using the active gate drive technique that adjusts the switching speed of the switching element Q2 during turn-off of the switching element Q2.

The gate drivers 11 and 12 have the same configuration as each other. Next, an example of a configuration of the gate driver (11 or 12) will be described with reference to FIG. 4. In the following description to explain the configuration of the gate driver (11 or 12), the gate driver (11 or 12) is referred to as a "gate driver 10".

Figure 4:
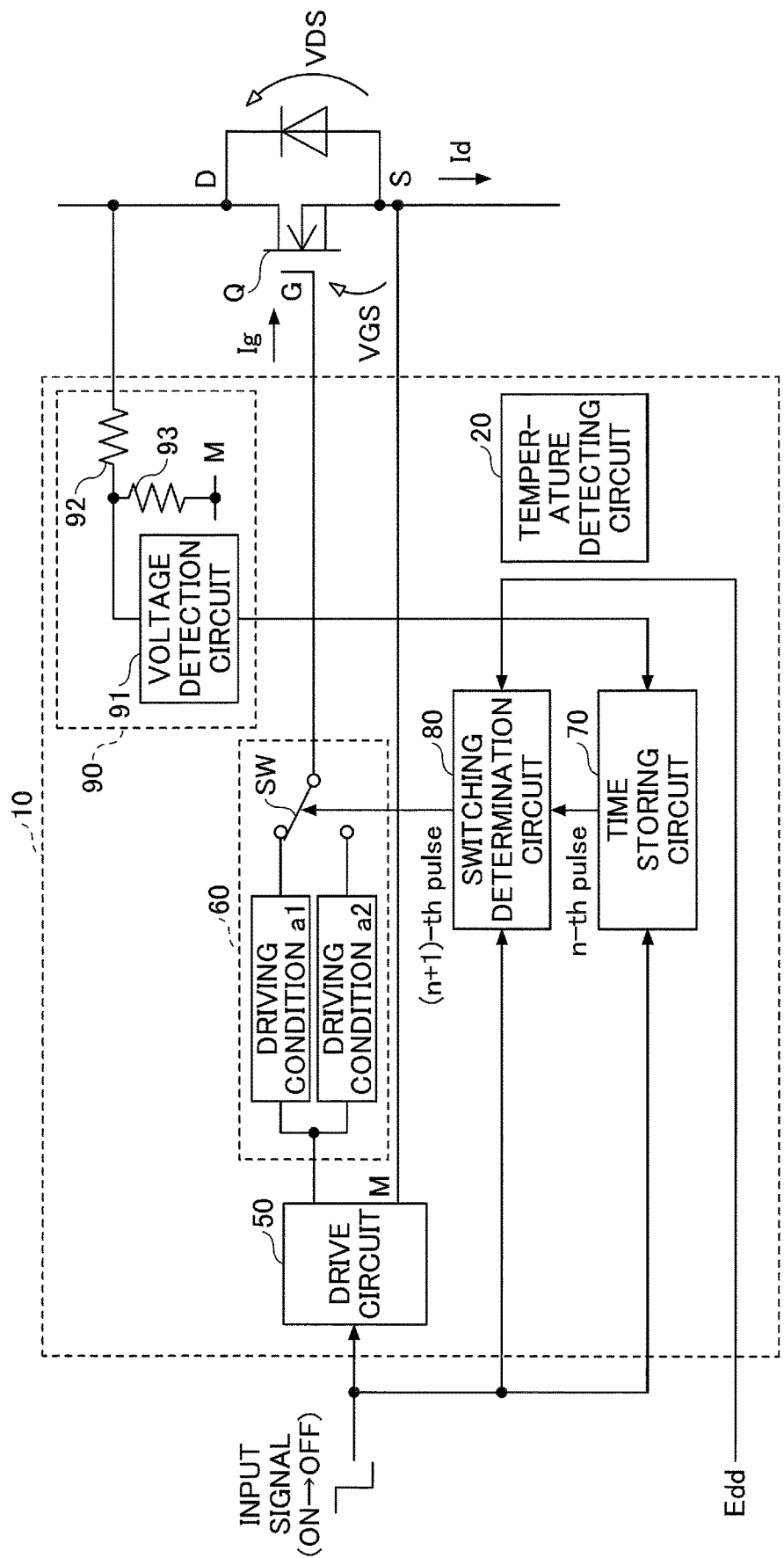
FIG. 4 is a diagram illustrating an example of a configuration of a gate driver.

FIG. 4 is a diagram illustrating the example of the configuration of the gate driver 10. The gate driver 10 illustrated in FIG. 4 is a circuit that drives the gate of the switching element Q. The switching element Q corresponds to the switching element Q1 or Q2 described above. The gate driver 10 includes a drive circuit 50, a switch-off surge detection circuit 90, a time storing circuit 70, a switching determination circuit 80, and a driving condition switching circuit 60.

The drive circuit 50 is a circuit that drives the gate of the switching element Q in response to an input signal from outside of the gate driver 10. The input signal is a signal instructing switching (on/off) of the switching element Q, for example, a pulse-width modulated signal (PWM signal). In a case in which a PWM signal is used as the input signal, the input signal at an active level (e.g., a high level) represents an on command for turning on the switching element Q, and the input signal at an inactive level (e.g., a low level) represents an off command for turning off the switching element Q. The drive circuit 50 operates by using an electric potential at a reference potential portion M connected to the source S of the switching element Q, as ground (0 V).

The switch-off surge detection circuit 90 detects switch-off surge that occurs between the drain D and the source S of the switching element Q when the switching element Q is turned off. Voltage between the drain D and the source S of the switching element Q that is raised above the power supply voltage Ed is called switch-off surge voltage.

The switch-off surge detection circuit 90, for example, observes voltage between the drain D and the source S of the switching element Q (VDS). When the switch-off surge detection circuit 90 detects that the voltage VDS exceeds predetermined magnitude (Va), the switch-off surge detection circuit 90 determines that switch-off surge occurs upon turning off the switching element Q. The predetermined magnitude Va may also be referred to as a "set voltage value Va". The set voltage value Va is preset to a value larger than a voltage value of the power supply voltage Ed and lower than the maximum value (peak value Vp) of the switch-off surge voltage that can occur in design. The peak value Vp of the switch-off surge voltage is, for example, a voltage value of the voltage VDS that occurs when the switching element Q is turned off while the power supply voltage Ed is at its maximum value Ed(max) and maximum main current (drain current Id) is flowing. Because the switch-off surge detection circuit 90 detects whether the voltage VDS exceeds the set voltage Va, the switch-off surge detection circuit 90 can detect occurrence of switch-off surge at an intermediate stage before the switch-off surge voltage reaches the peak value Vp.

The switch-off surge detection circuit 90 includes, for example, a voltage detection circuit 91 that divides the voltage VDS by resistors 92 and 93 and that determines whether or not magnitude of the voltage VDS exceeds the set voltage value Va based on a voltage value obtained by dividing the voltage VDS by the resistors 92 and 93.

The switch-off surge detection circuit 90 may detect switch-off surge by a method other than the aforementioned method for detecting that the voltage VDS exceeds the set voltage Va. For example, the switch-off surge detection circuit 90 may detect switch-off surge by detecting a predetermined change in a change rate of drain current Id with respect to time (dI/dt).

When the switch-off surge detection circuit 90 has detected occurrence of switch-off surge, the switch-off surge detection circuit 90 outputs a detection signal, which indicates that the occurrence of the switch-off surge has been detected, to the time storing circuit 70.

The time storing circuit 70 stores a time width $\Delta t$ from a time when the input signal is switched to an off command to a time when switch-off surge is detected by the switch-off surge detection circuit 90. For example, the time storing circuit 70 stores the time width $\Delta t$ from an edge timing when the input signal switches from an on command to an off command, to a time when the detection signal supplied from the switch-off surge detection circuit 90 is input, by using a counter or filter. The time storing circuit 70 updates the time width $\Delta t$ in each turn-off (i.e., each time the input signal switches to an off command).

The switching determination circuit 80 determines whether or not a gate driving condition of the switching element Q should be switched, in accordance with the detected value Edd of the power supply voltage Ed. For example, the switching determination circuit 80 determines that the gate driving condition should be switched when the detected value Edd is equal to or greater than a predetermined determination value Ed(ref), and the switching determination circuit 80 determines that the gate driving condition should not be switched when the detected value Edd is smaller than the determination value Ed(ref). The determination value Ed(ref) is set to a voltage value (=Ed(max)−α) between the maximum value Ed(max) that the power supply voltage Ed can take and the minimum value Ed (min) that the power supply voltage Ed can take. α is a non-negative value.

The switching determination circuit 80 outputs a timing signal $\Delta tw$ that causes the driving condition switching circuit 60 to change the gate driving condition of the switching element Q at an intermediate timing tm, in accordance with a determination result as to whether or not the gate driving condition of the switching element Q should be changed. In the present embodiment, a timing when the gate driving condition of the switching element Q is changed during a turn-off operation of the switching element Q such that switching speed of the switching element Q is changed during its turn-off, is referred to as the intermediate timing tm. The intermediate timing tm is at a time before switch-off surge voltage reaches its peak.

At a time of current turn-off, in accordance with the determination result of the switching determination circuit 80, the driving condition switching circuit 60 changes the gate driving condition at the intermediate timing tm, which is after elapse of time corresponding to the time width $\Delta t$ having been stored in the time storing circuit 70 at a time of previous turn-off after turn-off of the switching element Q is initiated.

In response to an output of the timing signal $\Delta tw$ from the switching determination circuit 80, the driving condition switching circuit 60 changes the gate driving condition of the switching element Q at the intermediate timing tm determined by the switching determination circuit 80. In FIG. 4, driving conditions a1 and a2 each having different conditions are exemplified as the gate driving conditions. However, more than two different driving conditions may be set in the driving condition switching circuit 60.

The driving condition switching circuit 60 selects one of the driving conditions a1 and a2 in accordance with the timing signal $\Delta tw$. For example, the driving condition switching circuit 60 selects the driving condition a1 during a period in which the timing signal $\Delta tw$ is not output from the switching determination circuit 80, and selects the driving condition a2 during a period in which the timing signal Δtw is output from the switching determination circuit 80.

In a case in which the driving condition a2 is selected at a time of current turn-off, the driving condition switching circuit 60 changes the gate driving condition to a condition in which the turn-off speed of the switching element Q decreases, at the intermediate timing tm, which is after elapse of time corresponding to the time width Δt having been stored in the time storing circuit 70 at a time of previous turn-off after turn-off of the switching element Q is initiated.

The driving condition switching circuit 60 includes, for example, two gate resistors each having a different resistance value, and a switch circuit for switching between the two gate resistors which is connected to the gate of the switching element Q. The resistance value of the gate resistor connected to the gate of the switching element Q when the driving condition a1 is selected is smaller than the resistance value of the gate resistor connected to the gate of the switching element Q when the driving condition a2 is selected.

Accordingly, during a turn-off operation of the switching element Q by the drive circuit 50, by selecting the driving condition a1 in which the resistance value of the gate resistor is reduced, switching speed (turn-off speed) of the switching element Q increases. Therefore, switching losses at turn-off can be reduced. Meanwhile, during the turn-off operation of the switching element Q by the drive circuit 50, by selecting the driving condition a2 in which the resistance value of the gate resistor is increased, switching speed (turn-off speed) of the switching element Q decreases. Therefore, because a change rate (dI/dt) of drain current flowing through the switching element Q with respect to time decreases, switch-off surge voltage can be suppressed.

The driving condition switching circuit 60 may also be configured to have two current sources for supplying current to the gate of the switching element Q (may also be referred to as "gate current sources"), each of which supplies a different magnitude of current (current value), and to have a switch circuit for switching between the two gate current sources which is connected to the gate of the switching element Q. The current value of the gate current source connected to the gate of the switching element Q when the driving condition a1 is selected is greater than the current value of the gate current source connected to the gate of the switching element Q when the driving condition a2 is selected. Alternatively, the driving condition switching circuit 60 may have two voltage sources (may also be referred to as "gate voltage sources") for applying voltage to the gate of the switching element Q each of which outputs a different magnitude of voltage (voltage value), and a switch circuit for switching between the two gate voltage sources which is connected to the gate of the switching element Q. The voltage value of the gate voltage source connected to the gate of the switching element Q when the driving condition a1 is selected is greater than the voltage value of the gate voltage source connected to the gate of the switching element Q when the driving condition a2 is selected.

Accordingly, during a turn-off operation of the switching element Q by the drive circuit 50, by selecting the driving condition a1 in which magnitude of current flowing into the gate or magnitude of voltage applied to the gate increases, switching speed (turn-off speed) of the switching element Q increases. Therefore, switching losses at turn-off can be reduced by selecting the driving condition a1, in which a current value of the gate current source or a voltage value of the gate voltage source, is increased during the turn-off operation of the switching element Q by the drive circuit 50. Meanwhile, during a turn-off operation of the switching element Q by the drive circuit 50, switching speed (turn-off speed) of the switching element Q decreases by selecting the driving condition a2 in which magnitude of current flowing into the gate or magnitude of voltage applied to the gate decrease. Therefore, during the turn-off operation of the switching element Q by the drive circuit 50, by selecting the driving condition a2 in which the current value of the gate current source or the voltage value of the gate voltage source is reduced, a change rate (dI/dt) of drain current flowing through the switching element Q with respect to time decreases, and switch-off surge voltage can be suppressed.

The switching determination circuit 80 determines whether or not to switch the gate driving conditions of the switching element Q in accordance with the detected value Edd of the power supply voltage Ed. At a time of current turn-off, the driving condition switching circuit 60 changes the gate driving condition at the intermediate timing tm, which is after elapse of time corresponding to the time width Δt having been stored in the time storing circuit 70 at a time of previous turn-off, in accordance with a determination result of the switching determination circuit 80. Therefore, because whether or not the gate driving condition should be changed can be switched according to magnitude of the power supply voltage Ed, it is possible to both suppress the switch-off surge voltage and reduce the switching losses even if the power supply voltage Ed varies.

For example, it can be prohibited to switch the gate driving condition to a condition in which turn-off speed of the switching element Q decreases in a situation in which switch-off surge voltage applied to the switching element Q is relatively low due to decrease in the power supply voltage Ed. Accordingly, it is possible to suppress increase in turn-off losses that occurs because of a change rate dI/dt of drain current with respect to time at a time of turn-off becoming gentle, in a situation in which the switch-off surge voltage decreases due to decrease in the power supply voltage Ed.

Next, with reference to FIGS. 4, 5, and 6, differences in operations of the gate driver 10 depending on magnitude of the power supply voltage Ed will be described.

Figure 5:
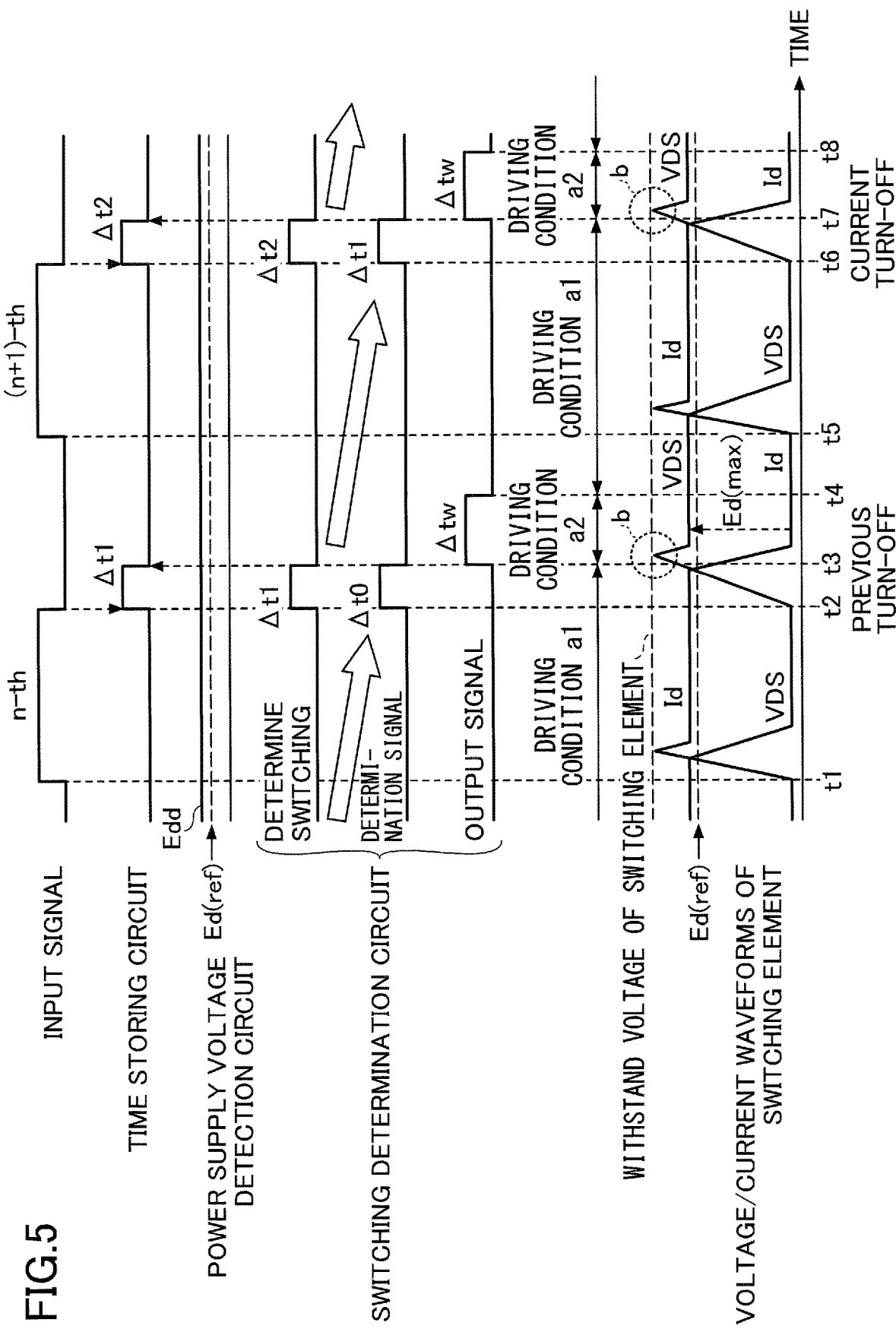
FIG. 5 is a timing chart illustrating an example of an operation of the gate driver in a case in which power supply voltage is high.

FIG. 5 is a timing chart illustrating an example of the operation of the gate driver 10 when the detected value Edd of the power supply voltage Ed is equal to or greater than the determination value Ed(ref) (more specifically, when the power supply voltage Ed is at maximum value Ed(max)).

The drive circuit 50 supplies a control signal (gate drive signal) to a control terminal (gate) of the switching element Q through the driving condition switching circuit 60, in accordance with an input signal that causes switching of the switching element Q. In this example, a high level input signal represents an on command of the switching element Q, and a low level input signal represents an off command of the switching element Q. Note that, in the following description, an operation of the gate driver 10 from a time when n-th (n is an integer greater than 0) high level input signal (on command) is input to the drive circuit 50 will be described, as illustrated in FIG. 5.

If the input signal is changed from an off command to an on command, the switching element Q starts turning on in accordance with the control signal input to the control terminal (at time t1). Drain-source voltage VDS of the switching element Q starts decreasing, and drain current Id starts increasing.

Thereafter, when the input signal changes from an on command to an off command, the switching element Q starts turning off (at time t2) in accordance with the control signal input to the control terminal. At the same time as the input signal changes to an off command, the time storing circuit 70 begins to measure the time width Δt. For example, after the input signal is changed to an off command, the time storing circuit 70 starts counting from a predetermined count start value, so that the time width Δt can be expressed by a numerical value or a voltage value.

When the turn-off of the switching element Q is initiated and switch-off surge is detected by the switch-off surge detection circuit 90, the switch-off surge detection circuit 90 outputs, to the time storing circuit 70, a detection signal indicating that the switch-off surge is detected.

The time storing circuit 70 stops counting at the same time as the detection signal supplied from the switch-off surge detection circuit 90 is input, stores a measured value Δt1 of the time width Δt for the n-th turn-off, and outputs a signal representing the measured value Δt1 to the switching determination circuit 80. Each time the switching element Q is turned off, the time storing circuit 70 stores a measured value of the time width Δt for the turn-off, and outputs a signal representing the measured value of the time width Δt to the switching determination circuit 80.

In FIG. 5, because the detected value Edd of the power supply voltage Ed at a current time (at the time of n-th turn-off) is larger than the determination value Ed(ref), the switching determination circuit 80 determines that the gate driving condition should be switched. The switching determination circuit 80 outputs the timing signal Δtw at time t3, which is a time when the time width Δt corresponding to a measured value Δt0 has elapsed from a time when the input signal was changed from an on command to an off command. In the present embodiment, the measured value Δt0 represents a measured value of the time width Δt that is obtained by the time storing circuit 70 for previous turn-off ((n−1)-th turn-off). The time t3 corresponds to the intermediate timing tm described above. Note that the time t2, which is a time of starting measurement of the time width Δt by the time storing circuit 70, may be a timing when the input signal is changed from an on command to an off command, but may be a timing when the drive circuit 50 starts a turn-off operation of the switching element Q in response to the input signal being switched from the on command to the off command.

As described above, during a period from the time t2 (when the turn-off operation is started) to the time t3, the drain-source voltage VDS starts increasing while the gate driving condition remains at the driving condition a1. Because the driving condition a1 is a condition that increases turn-off speed as compared to the driving condition a2, switching speed during a first half of a turn-off period is accelerated, and thereby switching losses are reduced.

When time corresponding to Miller plateau of the switching element Q elapses and the drain current Id starts decreasing rapidly, surge voltage occurs in proportion to a change rate of the drain current Id with respect to time. However, when an output of the timing signal Δtw is started at time t3, the gate driving condition is switched from the driving condition a1 to the driving condition a2, so that the switching speed during the second half of the turn-off period is reduced and switch-off surge voltage can be reduced (see circles b in FIG. 5). For example, the driving condition switching circuit 60 may increase a resistance value of the gate resistor connected to the gate of the switching element Q at time t3, or may decrease a current value of the gate current flowing into the gate of the switching element Q at time t3.

At time t4, which is a time when a predetermined time elapses after the time t3 when the gate driving condition is changed to the driving condition a2 in which the turn-off speed decreases, the driving condition switching circuit 60 returns the gate driving condition to an original gate driving condition (gate driving condition a1) which is the gate driving condition before changing. The time t4 is a time before time t5, and the time t5 is a time when the input signal switches to the next on command.

Times t5 to t8 in (n+1)-th switching respectively correspond to the times t1 to t4 in the above-described n-th switching. That is, the switching determination circuit 80 outputs the timing signal Δtw at time t7 when the time width Δt corresponding to a measured value Δt1 has elapsed from time t6 when the input signal is changed from an on command to an off command. The measured value Δt1 corresponds to the measured value of the time width Δt that is obtained by the time storing circuit 70 at a time of the n-th turn-off. The time t7 corresponds to the aforementioned intermediate timing tm. The time t6, which is a time of starting measurement of the time width Δt by the time storing circuit 70, may be a timing when the input signal is changed from an on command to an off command, but may be a timing when the drive circuit 50 starts a turn-off operation of the switching element Q in response to the input signal being switched from the on command to the off command.

Meanwhile, FIG. 6 is a timing chart illustrating an example of the operation of the gate driver 10 when the detected value Edd of the power supply voltage Ed is less than the determination value Ed(ref) (more specifically, when the power supply voltage Ed is the minimum value Ed (min)).

In this case, the switching determination circuit 80 determines that the gate driving condition is not switched because the detected value Edd of the power supply voltage Ed at the current time is smaller than the determination value Ed(ref). That is, the switching determination circuit 80 does not output the timing signal Δtw at time t3. Accordingly, during turn-off, the gate driving condition is maintained at the driving condition a1 without switching to the driving condition a2. Therefore, increase in turn-off losses caused by reduction of switching speed is prevented (see circle c). In addition, even if reduction of switch-off surge voltage by reduction of switching speed is not actively performed (see circle d), the switch-off surge voltage applied to the switching element Q does not exceed withstand voltage of the switching element Q because the low power supply voltage Ed does not cause the switch-off surge voltage to be too high.

That is, it can be prohibited to switch the gate driving condition to a condition in which turn-off speed of the switching element Q decreases in a situation in which switch-off surge voltage occurring in the switching element Q is relatively low due to decrease in the power supply voltage Ed. Accordingly, it is possible to suppress increase in turn-off losses that occurs because of a change rate dI/dt of drain current with respect to time at a time of turn-off becoming gentle, in a situation in which the switch-off surge voltage decreases due to decrease in the power supply voltage Ed. Thus, according to the technique of the present disclosure, even if the power supply voltage Ed varies, both suppression of switch-off surge voltage and reduction of switching losses can be achieved.

Here, as magnitude of switch-off surge voltage varies in accordance with a temperature of the switching element Q, the switching determination circuit 80 may change the determination value Ed(ref) according to the temperature of the switching element Q (which may include ambient temperature of the switching element Q). Accordingly, because a criterion of determination, as to whether or not the gate driving condition should be changed, can be adjusted according to the temperature of the switching element Q, it is possible to maintain compatibility of reduction of the switch-off surge voltage and reduction of the switching losses even if the temperature of the switching element Q varies. In a case in which the determination value Ed(ref) is defined as "Ed(max)−α", the switching determination circuit 80 changes the determination value Ed(ref) by changing α.

For example, as illustrated in FIG. 4, the gate driver 10 includes a temperature detecting circuit 20 for detecting the temperature of the switching element Q. The temperature detecting circuit 20 detects the temperature of the switching element Q by applying constant current to a diode provided near the switching element Q, and by measuring forward voltage of the diode. The temperature detecting circuit 20 may detect the temperature of the switching element Q by using other methods. The switching determination circuit 80 may change the determination value Ed(ref) according to the temperature detected by the temperature detecting circuit 20.

The switching element Q has a property such that magnitude of switch-off surge voltage decreases as a temperature of the switching element Q increases. In view of this property, in a case in which a temperature of the switching element Q is high, the switching determination circuit 80 may cause the determination value Ed(ref) to be higher than that in a case in which the temperature of the switching element Q is low. Thus, for example, in a case in which switch-off surge voltage occurring in the switching element Q becomes relatively low caused by temperature increase in the switching element Q, it can be prohibited to switch a gate driving condition to a condition in which turn-off speed of the switching element Q decreases. Accordingly, it is possible to suppress the increase in turn-off losses that occurs because of a change rate dI/dt of drain current with respect to time at a time of turn-off becoming gentle, when switch-off surge voltage decreases due to temperature increase in the switching element Q. In a case in which the determination value Ed(ref) is defined as "Ed(max)−α", the switching determination circuit 80 can increase the determination value Ed(ref) by reducing α.

Although the gate driver and the power converter have been described in accordance with the embodiments, the present invention is not limited to the embodiments described above. Various modifications and enhancements, such as combinations and substitutions with some or all of the other embodiments, are possible within the scope of the present invention.

For example, a power converter including at least one gate driver is not limited to a DC-DC converter that converts direct current to another direct current. Examples of the power converter include an inverter for converting direct current to alternating current, a step-up converter for increasing an input voltage and and outputting the increased voltage, a step-down converter for decreasing an input voltage magnitude and outputting the decreased voltage, and a buck-boost converter for causing an output voltage magnitude to be greater than or less than an input voltage magnitude.

What is claimed is:

1. A gate driver comprising:
   a drive circuit configured to drive a gate of a switching element connected between a high electric potential output of a power supply and a low electric potential output of the power supply, in accordance with an input signal indicating a command to turn on or to turn off the switching element;
   a switch-off surge detection circuit configured to detect switch-off surge that occurs in the switching element;
   a time storing circuit configured to measure, each time when the input signal is switched to a command to turn off the switching element, a time width from a time when the input signal is switched to the command to turn off the switching element to a time when the switch-off surge detection circuit detects occurrence of the switch-off surge and to store the time width when the time width is measured;
   a switching determination circuit configured to determine whether or not to switch a gate driving condition of the switching element, in accordance with a detected value of power supply voltage, the power supply voltage being a potential difference between the high electric potential output of the power supply and the low electric potential output of the power supply; and
   a driving condition switching circuit configured to switch the gate driving condition in accordance with a timing signal output from the switching determination circuit; wherein
   in response to the switching determination circuit determining to switch the gate driving condition at a time of an (n+1)-th turn off of the switching element (n is an integer greater than 0),
      the switching determination circuit outputs the timing signal to the driving condition switching circuit when a time corresponding to the time width that is measured and stored by the time storing circuit at an n-th turn-off of the switching element elapses, since the (n+1)-th turn-off of the switching element is started; and
      the driving condition switching circuit switches the gate driving condition in response to receiving the timing signal from the switching determination circuit.

2. The gate driver according to claim 1, wherein the switching determination circuit is configured to determine to switch the gate driving condition in response to the detected value of the power supply voltage being equal to or greater than a determination value, and is configured to determine not to switch the gate driving condition in response to the detected value of the power supply voltage being less than the determination value.

3. The gate driver according to claim 2, wherein the switching determination circuit is configured to change the determination value in accordance with a temperature of the switching element.

4. The gate driver according to claim 3, wherein, in a case in which the temperature is high, the switching determination circuit is configured to cause the determination value to be higher than a determination value in a case in which the temperature is low.

5. The gate driver according to claim 1, wherein the driving condition switching circuit is configured to switch the gate driving condition to a condition in which turn-off speed of the switching element decreases, when the time corresponding to the time width that is measured and stored at the n-th turn-off of the switching element elapses after the (n+1)-th current turn-off of the switching element is started.

6. The gate driver according to claim 5, wherein the driving condition switching circuit is configured to increase resistance of a gate resistor connected to the gate of the switching element, to decrease the turn-off speed.

7. The gate driver according to claim 5, wherein the driving condition switching circuit is configured to reduce magnitude of current flow of the gate, to decrease the turn-off speed.

8. The gate driver according to claim 5, wherein the driving condition switching circuit is configured to return the gate driving condition to an original gate driving condition, when a predetermined time elapses after the gate driving condition is switched to the condition in which turn-off speed of the switching element decreases.

9. The gate driver according to claim 1, wherein the driving condition switching circuit is configured to switch the gate driving condition at a time before switch-off surge voltage applied to the switching element reaches a peak value.

10. A power converter comprising:
   a switching element connected between a high electric potential output of a power supply and a low electric potential output of the power supply;
   a drive circuit configured to drive a gate of the switching element in accordance with an input signal indicating a command to turn on or to turn off the switching element;
   a switch-off surge detection circuit configured to detect switch-off surge that occurs in the switching element;
   a time storing circuit configured to measure, each time when the input signal is switched to a command to turn off the switching element, a time width from a time when the input signal is switched to the command to turn off the switching element to a time when the switch-off surge detection circuit detects occurrence of the switch-off surge, and to store the time width when the time width is measured;
   a power supply voltage detection circuit configured to detect, as power supply voltage, a potential difference between the high electric potential output of the power supply and the low electric potential output of the power supply;
   a switching determination circuit configured to determine whether or not to switch a gate driving condition of the switching element, in accordance with the power supply voltage detected by the power supply voltage detection circuit; and
   a driving condition switching circuit configured to switch the gate driving condition in accordance with a timing signal output from the switching determination circuit; wherein
   in response to the switching determination circuit determining to switch the gate driving condition at a time of an (n+1)-th turn off of the switching element (n is an integer greater than 0),
      the switching determination circuit outputs the timing signal to the driving condition switching circuit when a time equivalent to the time width that is measured and stored by the time storing circuit at an n-th turn-off of the switching element elapses, since the (n+1)-th turn-off of the switching element is started; and
      the driving condition switching circuit switches the gate driving condition in response to receiving the timing signal from the switching determination circuit.

11. The power converter according to claim 10, further comprising:
   a voltage divider configured to divide the power supply voltage and to output a divided voltage; and
   an isolation amplifier configured to output a detected value of the power supply voltage, by receiving the divided voltage from the voltage divider.

12. The power converter according to claim 10, wherein the switching element is a wide bandgap device.

* * * * *